United States Patent
Brennan et al.

(10) Patent No.: US 7,136,322 B2
(45) Date of Patent: Nov. 14, 2006

(54) PROGRAMMABLE SEMI-FUSIBLE LINK READ ONLY MEMORY AND METHOD OF MARGIN TESTING SAME

(75) Inventors: Oliver Brennan, Adare (IE); Denis Doyle, Patrickswell (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/911,853

(22) Filed: Aug. 5, 2004

(65) Prior Publication Data

US 2006/0028894 A1  Feb. 9, 2006

(51) Int. Cl.
*G11C 17/18* (2006.01)
(52) U.S. Cl. .................... 365/225.7; 365/201
(58) Field of Classification Search ............... 365/96, 365/225.7, 201, 243
See application file for complete search history.

(56) References Cited

U.S. PATENT DOCUMENTS

| | | | |
|---|---|---|---|
| 3,641,516 A | 2/1972 | Castrucci et al. | |
| 4,422,092 A | 12/1983 | Guterman | |
| 5,208,780 A | 5/1993 | Iwase et al. | |
| 5,966,339 A * | 10/1999 | Hsu et al. | 365/225.7 |
| 6,246,243 B1 | 6/2001 | Audy | |
| 2005/0067670 A1* | 3/2005 | Hui | 257/529 |

OTHER PUBLICATIONS

U.S. Appl. No. 10/777,337, filed Feb. 12, 2004, Denis Doyle.

* cited by examiner

*Primary Examiner*—Richard Elms
*Assistant Examiner*—Hien N Nguyen
(74) *Attorney, Agent, or Firm*—Iandiorio & Teska

(57) ABSTRACT

A programmable read only memory includes a matrix of semi-fusible link memory cells, each including a semi-fusible link having an intact impedance and a blown impedance; a bit line voltage supply switching circuit for applying a current to at least one selected bit line; a word line address decoder for selecting a word line; and a program control logic circuit for blowing the semi-fusible links in the memory cells identified by the intersection of the selected word and bit lines; a method is disclosed of testing programmed and unprogrammed read only memory.

16 Claims, 8 Drawing Sheets

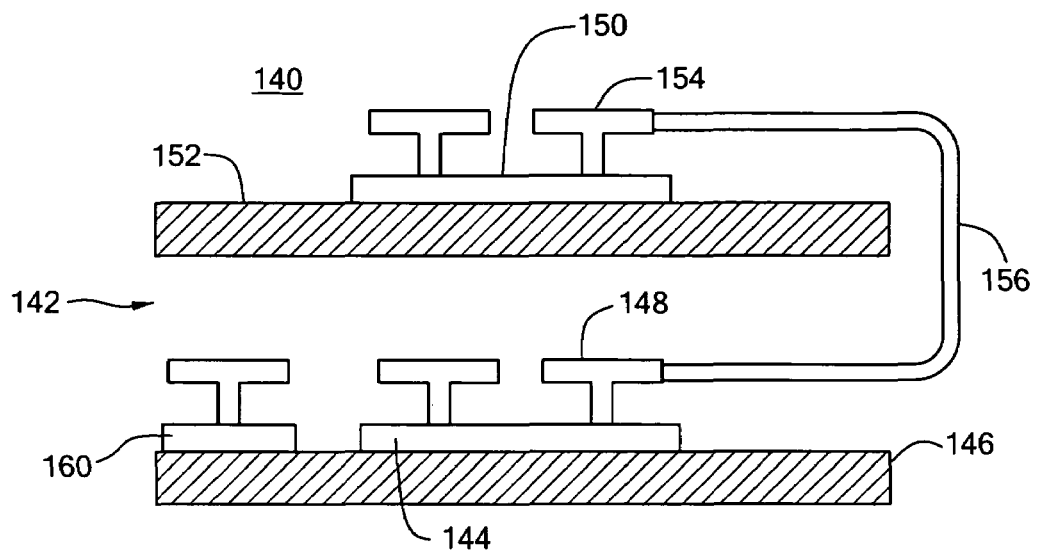
FIG. 7
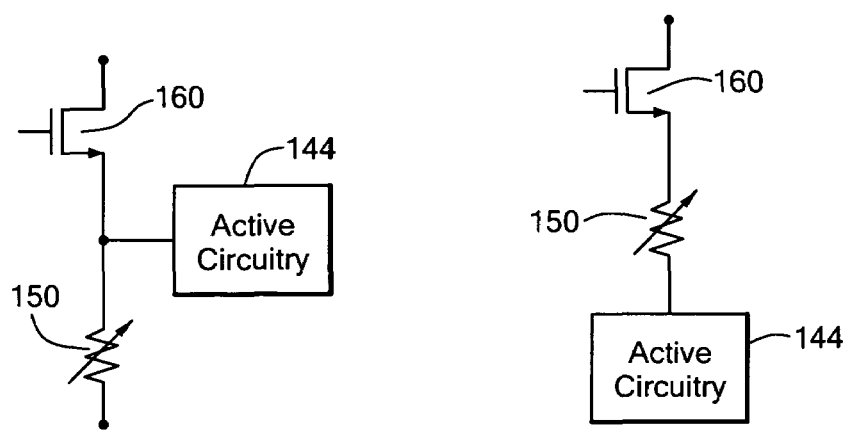
FIG. 8A  FIG. 8B

PROGRAMMABLE SEMI-FUSIBLE LINK READ ONLY MEMORY AND METHOD OF MARGIN TESTING SAME

FIELD OF THE INVENTION

This invention relates to a programmable read only memory, and more particularly to a one time only programmable read only memory using semi-fusible link memory cells and to a method of margin testing the programmed and unprogrammed memory.

BACKGROUND OF THE INVENTION

One-Time Programmable memory (OTP-Memory) refers to a read-only memory (ROM), which can be programmed one time after manufacture of a device (also called one-time programmable ROM or OTP-ROM). To-date there are examples of OTP-ROMs which have been realized using many technologies as the memory element. For example data can be stored by destructing diodes or oxide-films to form a low impedance path where previously there was a high impedance path. Also data can be stored in a floating gate transistor such that the floating gate retains charge and alters the transistors threshold voltage which is the basis for EPROM. Integrated fuses have also been used to realize OTP-ROM. By passing adequate current through a fuse it can be blown to create a high-impedance path where previously there was a low impedance path. These technologies have disadvantages that include relatively high currents to program, and relatively high voltages to program, i.e. above breakdown voltages for present day sub-micron CMOS technology. They also can be destructive to surrounding layers on an integrated circuit and require relatively large area and thus result in lower density memory. For example, U.S. Pat. No. 5,208,780, entitled "Structure of Electrically Programmable Read-Only Memory Cells and Redundancy Signature Therefor" discloses an OTP-ROM, which uses fuses as the memory element. However it requires high voltage (10V) to program the fuse and passes current through the fuse using an NMOS that goes into "snap-back" or secondary breakdown to provide the high current required to blow the fuse. This snap-back current will be relatively large and the NMOS device will have to be sized to avoid damage during snap-back. This results in a larger pass transistor than required in the present invention and which is thus less area-efficient. U.S. Pat. No. 3,641,516, entitled "Write Once Read Only Store Semiconductor Memory" discloses an OTP-ROM realized with back-to-back diodes as the memory element. To program this memory current or voltage is applied to the memory cell to cause one of the diodes to breakdown and results in a metal-silicon alloy short across its p-n junction. The voltage required to breakdown the p-n junction is typically 8V which is beyond that allowed for modern sub-micron MOS processes. U.S. Pat. No. 4,422,092, entitled "High Coupling Ratio Electrically Programmable ROM" is based on floating gate EPROM. The disadvantage of this approach is a high voltage required to program the device. In this example 15V is required on the drain and 25V on the gate for programming. This is well beyond the maximum voltage allowed for standard sub-micron CMOS processes and results in relatively specialized processes, which are more expensive.

BRIEF SUMMARY OF THE INVENTION

It is therefore an object of this invention to provide an improved programmable read only memory.

It is a further object of this invention to provide such an improved programmable read only memory which uses semi-fusible link memory cells.

It is a further object of this invention to provide such an improved programmable read only memory which requires lower program currents and voltage within breakdown ranges for conventional sub-micron (CMOS) processors.

It is a further object of this invention to provide such an improved programmable read only memory which uses small, thin film semi-fusible links and switches which require only low current, low area and are not destructive of surrounding features.

It is another object of this invention to provide a method of margin testing both programmed and unprogrammed such semi-fusible link memories.

The invention results from the realization that a smaller, lower voltage and current ROM can be achieved using a matrix of semi-fusible link memory cells each including a semi-fusible link having an intact impedance and a blown impedance and selecting one or more memory cells to be blown identified by the selected bit and word lines. The invention also realizes a method of margin testing programmed and unprogrammed such memories.

This invention features a programmable read only memory including a matrix of semi-fusible link memory cells, each containing a semi-fusible link having an intact impedance and a blown impedance. There is a bit line voltage supply switching circuit for applying a current to at least one selected bit line and a word line address decoder for selecting a word line. There is a program control logic circuit for blowing the semi-fusible link in the memory cells identified by the intersection of the selected word and bit lines.

In a preferred embodiment, there may be a sense amplifier circuit connected to the bit lines and a read control logic circuit for enabling the sense amplifier circuit to read out the state of the semi-fusible links in the memory cells addressed by the word line address decoder. The semi-fusible links may be thin film resistors; they may be made of silicon chromium. They may be semi anti-fusible links such as diode junctions. Each semi-fusible link memory cell may include a semi-fusible link and a selection switch connected between a bit line and a word line. The selection switch may include a semiconductor switch. The sense amplifier circuit may include a plurality of sense circuits, each including a reference cell and a comparator circuit responsive to the memory current from an associated memory cell and a reference current from the reference cell to provide a logic output representative of the relative values of those currents. The comparator circuit may include a current mirror for mirroring the memory current and a detector circuit responsive to the mirrored memory current and the reference current to provide a logic output representative of the relative values of the currents. The detector circuit may include a sensing node for summing the mirrored memory current and the reference current and an inverter responsive to the sensing node to provide a logic output representative of the relative values of the currents. The comparator circuits may include a differential amplifier having one input connected to the memory cell and one end of the current mirror and the other input connected to the reference cell in the other end of the current mirror. The reference cell may include a reference selection switch matched to the memory cell selection switch and reference impedance. The reference impedance may include a default impedance between the intact impedance and the blown impedance. The reference impedance may include a low margin impedance between a default impedance and the intact impedance; it may include a high margin impedance between the default impedance and the blown impedance. It may include a short margin impedance between the intact impedance and zero.

The invention also features a method of margin testing, a programmed programmable ROM, with semi-fusible link memory cells. Each memory cell including a semi-fusible link with an intact impedance and blown impedance. The method includes applying a supply voltage to a semi-fusible link memory cell and to a reference cell and employing a default impedance in a reference cell between the intact and blown impedances. The current from the reference cell is compared to the current from the memory cell and a determination is made as to whether the semi-fusible link of the memory is intact or blown.

In a preferred embodiment the method may further include employing a high margin impedance between the default and blown impedance and determining whether the semi-fusible link of the memory cell is blown within a high pre-determined margin. The method may further include employing a low margin impedance between the default and intact impedances and determining whether the semi-fusible link of the memory cell is still intact within a low pre-determined margin.

The invention also features a method of margin testing an un-programmed programmable ROM with semi-fusible link memory cells, each memory cell including a semi-fusible link with an intact impedance and a blown impedance. The method includes applying supply voltage to semi-fusible link memory cell and to a reference cell and employing a short impedance in the reference cell between the intact impedance and zero. The current from the reference cell is compared to the current from the memory cell and a determination is made as to whether the semi-fusible link of the memory cell is intact or shorted.

The invention also features a method of margin testing a programmed programmable ROM with semi-fusible link memory cells. Each memory cell includes a semi-fusible link with an intact impedance and a blown impedance. A supply voltage is applied to a semi-fusible link memory cell and to a reference cell and a default impedance is employed in the reference cell between the intact and blown impedances. The current from the reference cell is compared to the current of the memory cell and a determination is made as to whether the semi-fusible link of the memory cell is intact or open.

BRIEF DESCRIPTION OF THE DRAWINGS

Other objects, features and advantages will occur to those skilled in the art from the following description of a preferred embodiment and the accompanying drawings, in which:

FIG. 7 is a schematic diagram of one embodiment of a semi-fusible link system that may be used in this invention;

FIGS. 8A and 8B are exemplary circuit diagrams of the semi-fusible link system shown in FIG. 7

DISCLOSURE OF THE PREFERRED EMBODIMENT

Figure 1:
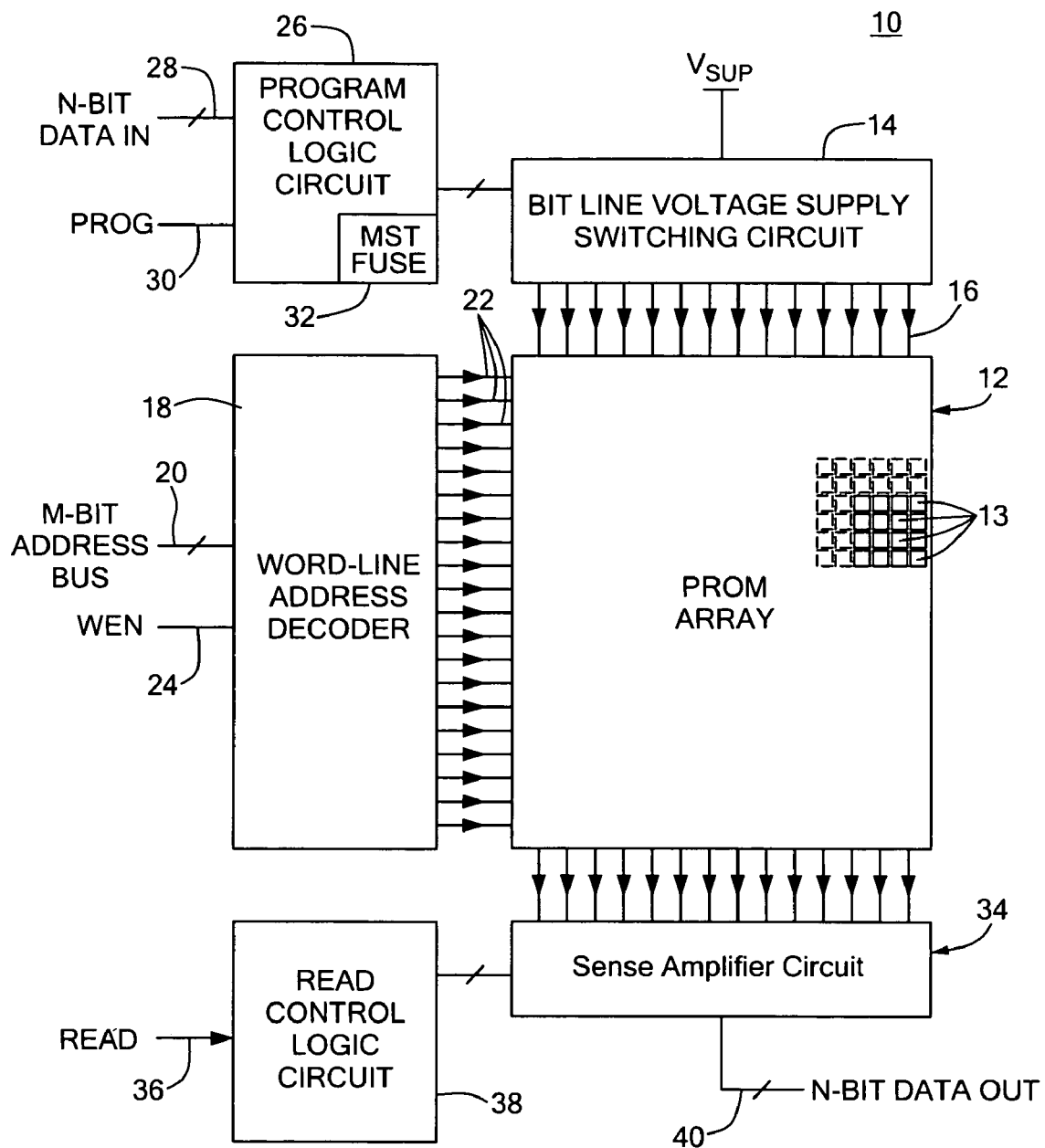
FIG. 1 is a schematic block diagram of a PROM with semi-fusible link memory cell according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

A semi-fusible link is typically a thin film resistor with an intact and blown states with the link having a first non-zero resistance when intact and a second higher but finite resistance when blown. This is accomplished by passing a pre-determined current through the link. This invention realizes that a thin film semi-fusible link made from e.g., silicon chromium or (SiCr) can be made small enough to be blown by passing a program current of as little as 2.6 mA through it. Such a semi-fusible link has an intact resistance of typically 1.4 kΩ and a blown resistance of at least 20 kΩ, typically 30 kΩ. The program current presently required to blow integrated fuses mostly made from poly-silicon has been roughly two orders of magnitude greater or approximately 200 mA. The lower current enabled by this invention results in smaller circuitry such as switches in the realization of a one-time only programmable read only memory. A further advantage of the semi-fusible link memory cells of this invention over integrated fuses is that the programming of the link from intact to blown states is benign or mild in that it is non-destructive to surrounding features and layers on the integrated circuit. The semi-fusible link usable in this invention may be as disclosed in U.S. Pat. No. 6,246,243, entitled "Semi-Fusible Link System", by Jonathan Audy, issued Jun. 12, 2002 and the semi-fusible link disclosed in U.S. patent application Ser. No. 10/777,337, entitled "Semi-Fusible Link System For A Multi-Layer Integrated Circuit And Method Of Making Same", by Denis Doyle, filed Feb. 12, 2004 both of which are incorporated herein in their entirety by this reference.

There is shown in FIG. 1 a programmable read only memory 10 according to this invention including a matrix array 12 of semi-fusible link memory cells 13 as described above. Bit line voltage supply switching circuit 14 selects the bit lines 16 to be connected to the voltage supply, $V_{sup}$. Word line address de-coder 18 receives the M-Bit address on bus 20 which identifies the word line 22 to be activated. That selected word line will be activated when the signal appears on the word enable line 24. At that point each of the semi-fusible link memory cells 13 in PROM matrix array 12 which is at the intersection of the addressed selected word line and the addressed selected bit lines will be identified as an active memory cell.

In the programming mode, program control logic circuit 26 responds to the N-bit data in signal on bus 28 to identify the ones of bit lines 16 that will be connected to the $V_{sup}$. When an enabling signal "prog" appears on line 30 those selected bit lines are enabled with sufficient current to blow the semi-fusible links in those identified memory cells. Typically the intact impedance would be for example 1.4 kΩ and the blown impedance would be 30 kΩ. The low intact condition might typically represent a logical zero while a high blown impedance would represent a logical one. After this has been done for each word line and the entire PROM matrix array 12 has been programmed, master fuse 32 may be blown to prevent the PROM matrix array 12 from ever being reprogrammed again.

Once PROM 12 has been programmed, it can be read out repeatedly, by sense amplifier circuit 34 by simply applying an M-bit address on bus 20, and a word enable signal on bus 24 to identify the memory cells to be read out and then applying a read signal on line 36 to read control logic circuit 38 to actually read out the sense amplifier circuit 34 to provide the N-bit data output on line 40.

Figure 2:
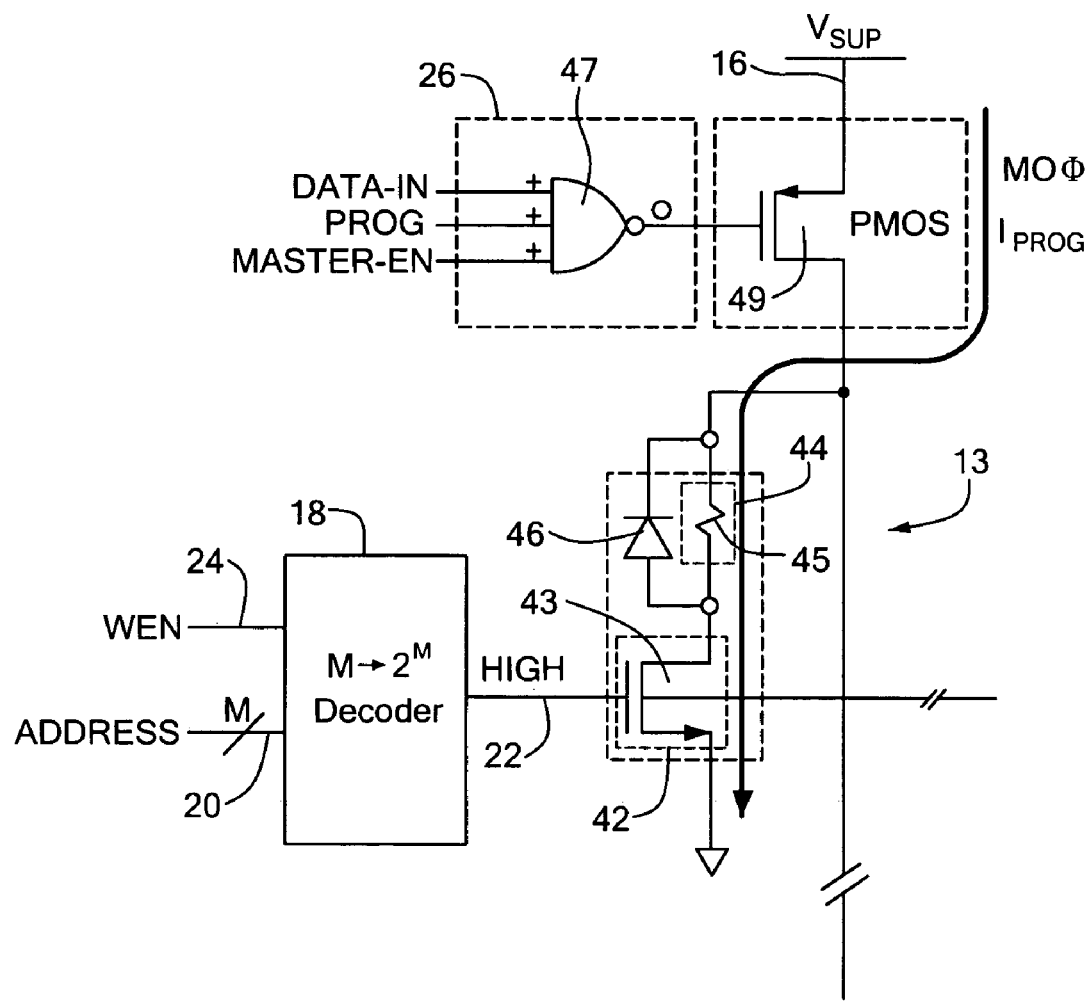
FIG. 2 is a more detailed schematic diagram of a portion of the ROM of FIG. 1 depicting programming of a semi-fusible link memory cell.

A more detailed simplified view of memory cells 13, FIG. 2, includes a selection switch 42, for example, such as a NMOS transistor 43 and a semi-anti fusible link 44, such as a thin film resistor 45 as explained above or a diode 46. If a diode is used as the semi-fusible link the "blowing" of the link is effected by providing a breakdown voltage e.g. 6 volts of reverse polarity across the diode junction. Conventional diode type memoires are antifuse links, i.e. they program from open to shortened. Program control logic circuit may include a three input NAND 47 gate, so that when the data in signal, prog signal and the master fuse enable signal are all high the output will be low or zero. This causes the associated switch, (see 14a, FIG. 5) one of a plurality included in bit line voltage supply switching circuit 14, to connect the bit line to $V_{sup}$. This causes the programming current $I_{prog}$ to flow through bit line selector switch 14a, which may be a PMOS transistor 49 as shown, and then through semi-fusible link 44 and selection switch 42. A relatively small current, e.g. 2.6 ma sufficient to blow semi-fusible link 44 is all that is necessary. Although the transistors throughout the description are shown as NMOS and PMOS types of transistors they may be CMOS, bipolar, or any other suitable semiconductor device.

Figure 3:
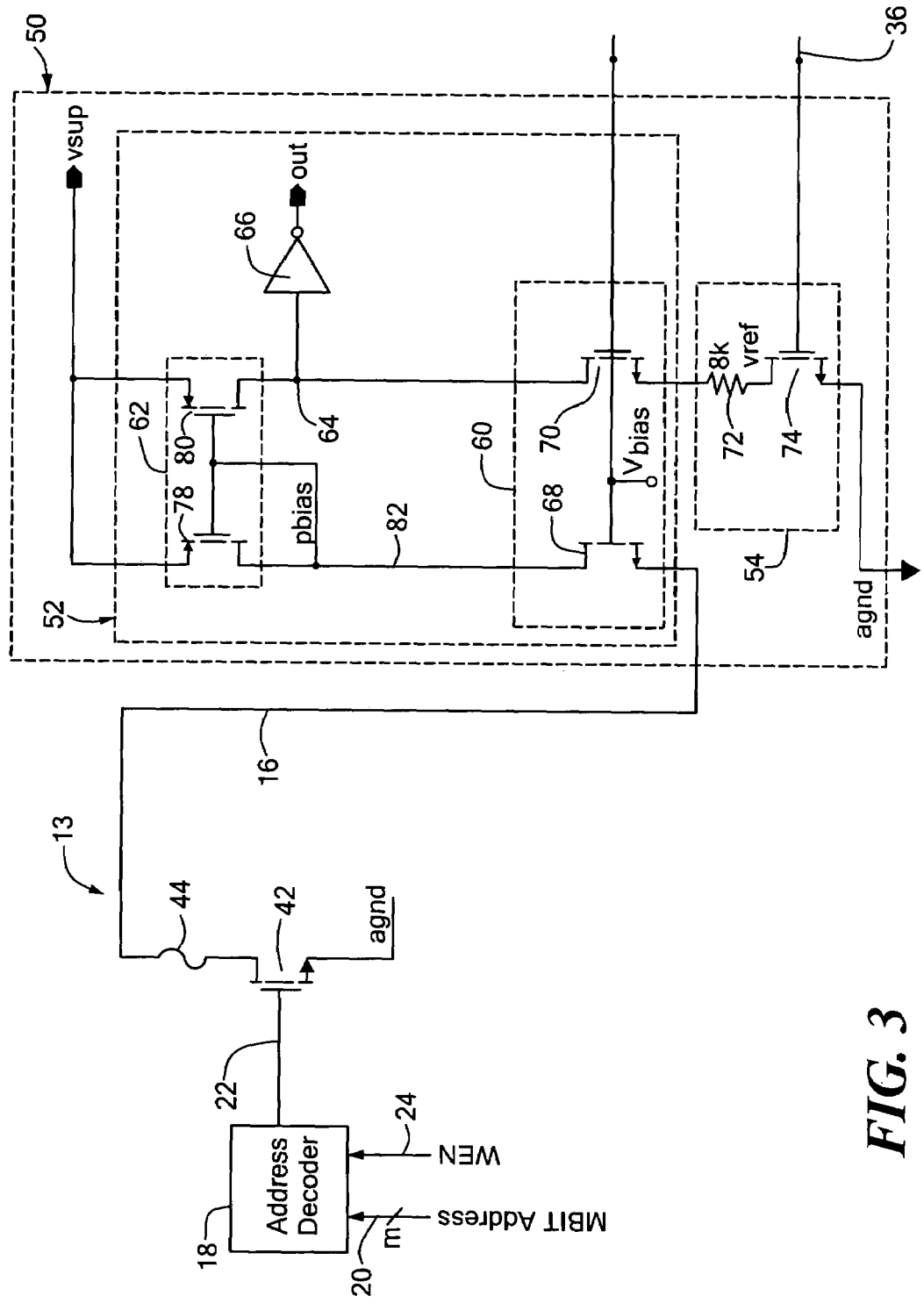
FIG. 3 is a more detailed schematic diagram of a portion of the sense amplifiers of FIG. 1.

The condition of the semi-fusible link in the memory cell as to whether it is intact or blown may be verified using the sense amplifier circuit which includes a plurality of sense circuits 50, FIG. 3, each of which may include a comparator circuit 52 and a reference cell 54. Comparator circuit 52 compares the memory current from memory cell 13 with a reference current from reference cell 54. If the memory current is higher than the reference current that indicates that the fuse is still intact with the impedance of typically 1.4 kΩ representing a logical zero. If the reference current is greater than the memory current that indicates that the semi-fusible link has been blown and has a relatively higher impedance e.g., 30 kΩ representing a logical one. Comparator circuit 52 may actually include a differential amplifier 60, current mirror 62, sensing node 64, and an inverter 66. When a particular semi-fusible link memory 13, is identified, the current flowing through it is delivered on bit line 16 to differential amplifier 60 which includes two semiconductor devices or transistors 68 and 70 whose bases are biased by input voltage $V_{bias}$. One of the semiconductors 68 is connected to the bit line 16 and receives the memory current, the other, 70, is connected to reference cell 54. Reference cell 54 includes a default impedance somewhere between the intact impedance of typically 1.4 kΩ and the blown impedance of typically 30 kΩ. In this case, the impedance is chosen to be 8 kΩ. Reference cell 54 also includes a selection switch 74 which is a transistor that matches in characteristics the transistor 42 in memory cell 13. When enabled by a signal on read line 36 at the gate of selection switch 74 a reference current flows through the other semiconductor 70 of differential amplifier 60. Current mirror 62, including semiconductors 78 and 80 mirrors the memory current on line 82 so that it appears at sense node 64. If that mirrored memory current at sense node 64 is greater than the reference current at node 64 coming from semiconductor 70 then sense node 64 will be pulled towards positive supply rail, $V_{sup}$, resulting in a high input to inverter 66 which then produces a low output representing a logical zero. Thus when semi-fusible link 44 is intact and a low impedance e.g. 1.4 kOhm, the output indicated is a logical zero. Conversely, when semi-fusible link 44 is blown and its resistance is substantially higher e.g. 30 kOhm the mirrored memory current at sense node 64 will be less than the reference current, so sense node 64 will be pulled towards ground rail 'agnd' resulting in a low input to inverter 66 and its output will therefore be driven high representing a logical one indicating that the semi-fusible link is in it's high impedance or blown state.

Figure 4:
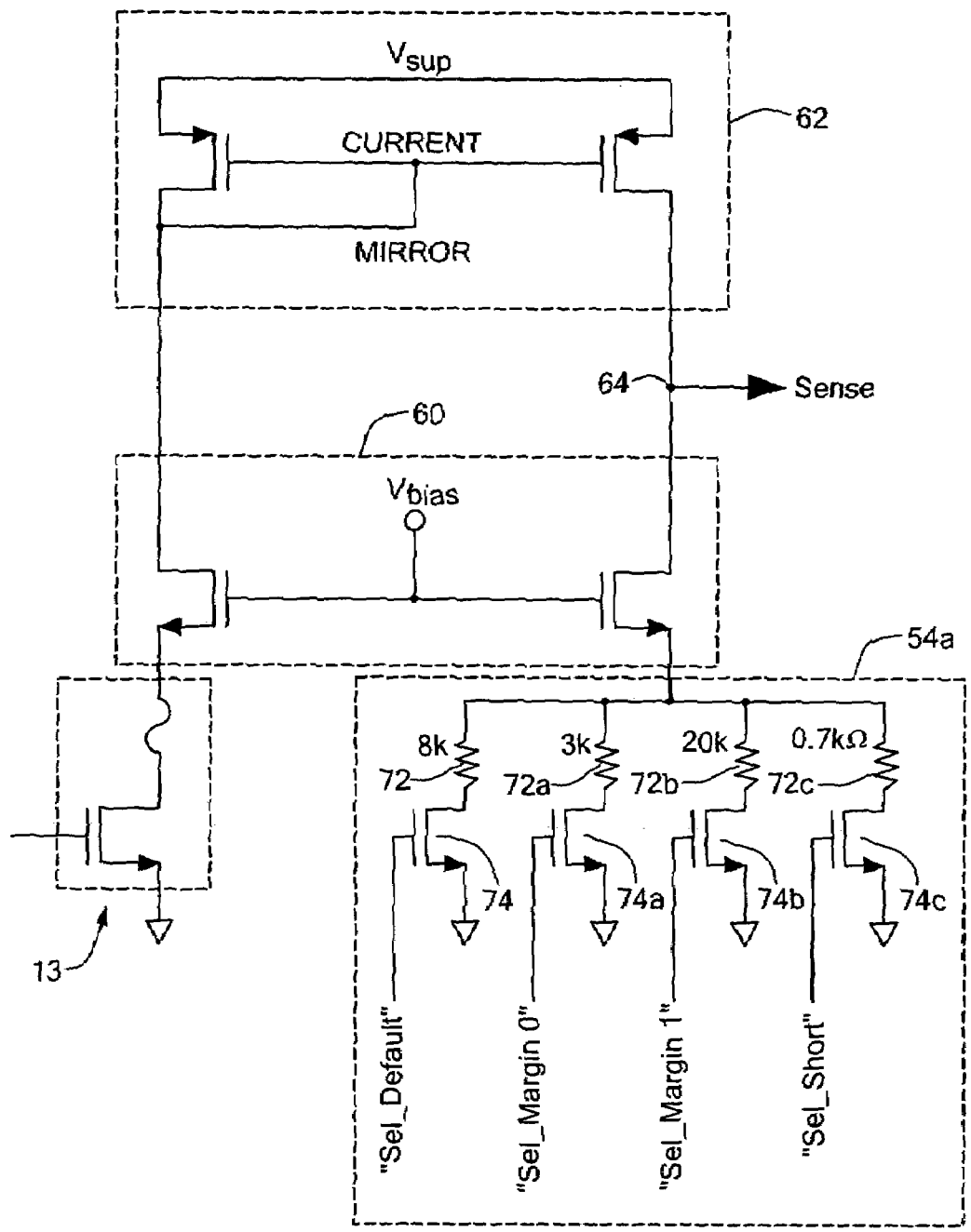
FIG. 4 is a more detailed schematic diagram of a portion of another embodiment of the sense amplifiers of FIG. 1 for marginal testing.

Margin testing for the one-time programmed semi-fusible link memory cells may be accomplished by using a reference cell 54a, FIG. 4, that has one or more additional margin test impedances in addition to the default impedance. Thus reference cell 54a, may in addition to 8 kΩ default impedance 72 and selection switch 74, may include a low margin impedance 72a and selection switch 74a, a high margin e.g. 20 kΩ impedance 72b and selection switch 74b, and a short margin e.g. 0.7 kΩ impedance. 72c and a short margin selection switch 74c. Then the semi-fusible link can be tested against the 8 kΩ impedance 72 to see whether it is greater or lesser in a course verification. But then it may be tested against the current drawn by the 3 kΩ reference resistor 72a to verify the low margin and/or the 20 kΩ high margin impedance 72b to verify the high margin. These three margin tests using impedances 72, 72a, and 72b verify the condition of the semi-fusible link as to whether it is intact or blown after its initial programming.

However, in cases where the PROM matrix 12 may be shipped un-programmed it still must be tested to assure that all of the semi-fusible links are intact and not shorted or open by some processing error. For the purpose of ensuring a fuse is not shorted the short margin impedance 72c of 0.7 kOhm which is between intact impedance 1.4 kOhm and zero or short is used to read back the memory cells stored value. For the purpose of ensuring a fuse is not open the default impedance 72 of 8 kOhm is used to read back the memory cells stored value. Using both short margin and default reference resistances in this way it can be verified that the intact impedance is in fact intact and not shorted, open or otherwise impaired.

Figure 5:
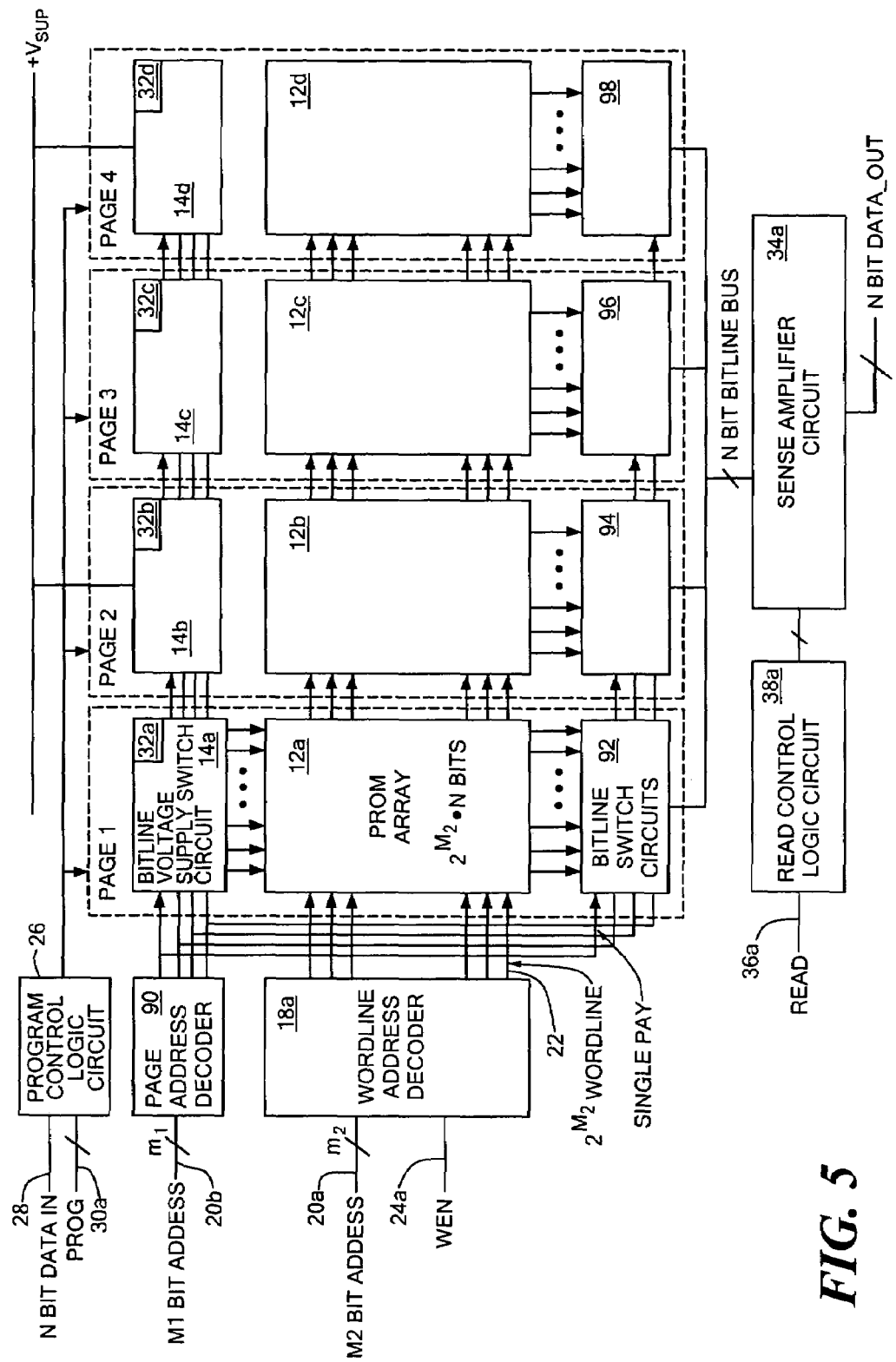
FIG. 5 is a schematic block diagram of a multistage PROM with semi-fusible link memory cells similar to FIG. 1.

Although thus far the invention has been shown employed in a simple single page PROM, this is not a necessary limitation of the invention. For example, as shown in FIG. 5, the invention may be used in a multi-page memory including PROM matrix arrays 12a, 12b, 12c, and 12d, each serviced by a bit line voltage supply switching circuit 14a, 14b, 14c, 14d, each of which may include the master fuse, 32a, 32b, 32c, and 32d which had previously been in the program control logic circuit 26 in embodiment of FIG. 1. There is also added a page address decoder 90 which receives a portion of the M-bit address on line 20b and enables the selected one of the pages to be addressed. Page address decoder 90 also controls the bit line switch circuits 92, 94, 96 and 98 in order to properly direct outputs from the PROMs 12a–d.

Figure 6:
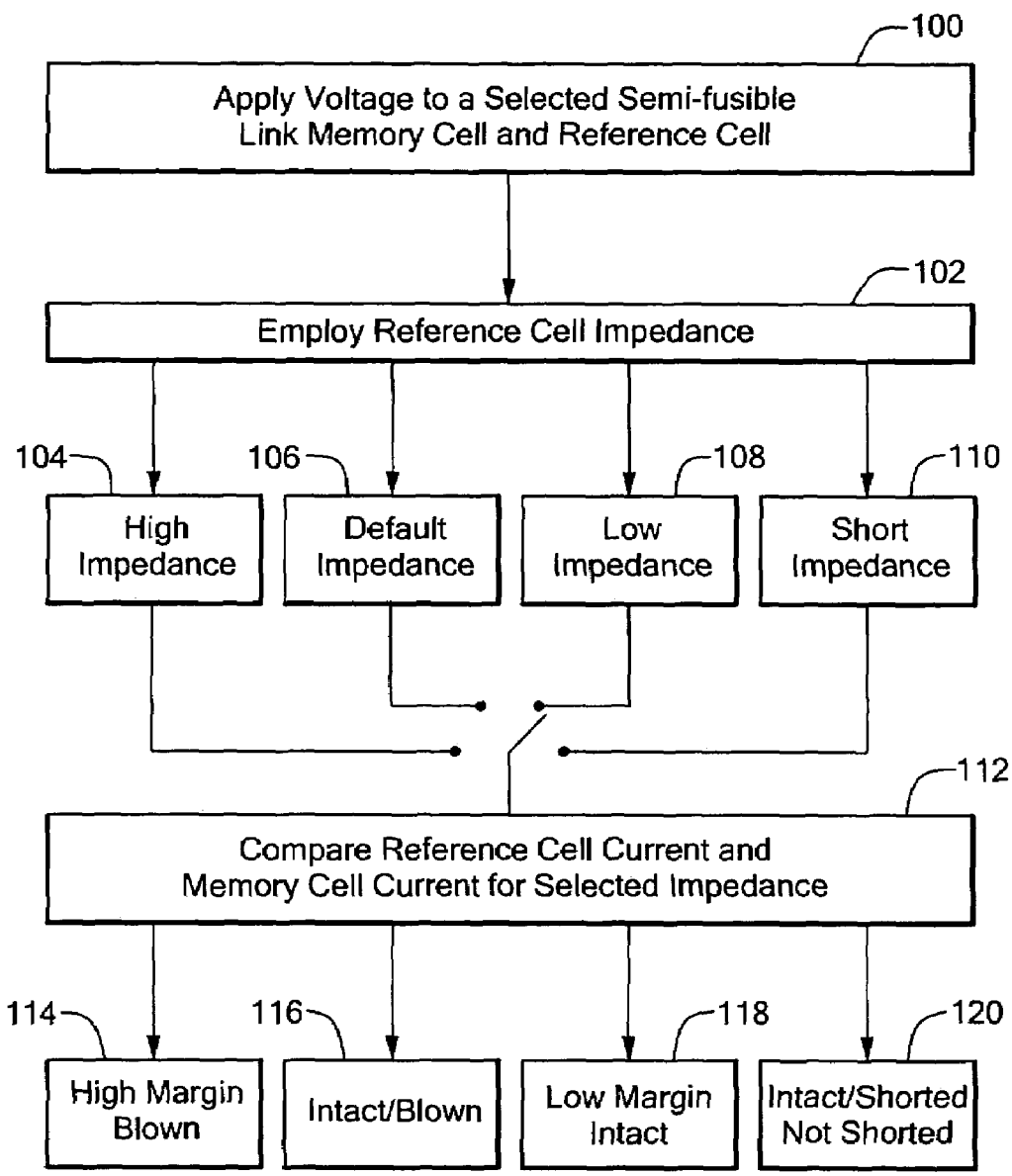
FIG. 6 is a schematic flow chart of the method of semi-fusible link status verification according to this invention.

The invention also applies to a method of testing or verifying the status of the semi-fusible links as intact or blown as shown in FIG. 6. The first step 100 is to apply a voltage to a selected semi-fusible link memory cell and reference cell. Next, step 102 a reference cell impedance is employed which may be high impedance 104, default impedance 106, low impedance 108 or short impedance 110. The selected one of these is connected to the comparator circuit to compare in step 112 to compare the reference cell current and the memory cell current for the selected impedance. If the high impedance was chosen then the indication will be whether the semi-fusible link has been blown with a high margin 114. If the default impedance was chosen then the indication will be whether it is intact or blown 116. If the low margin impedance was chosen the indication will be whether it is intact within the low margin 118 and if the short impedance was chosen the indication will be whether the intact semi-fusible link is truly intact or perhaps shorted 120. Although the method is comprehensively shown as embodying all these options: default, low, high and short margin impedance with means to select any one of them at a time, this is not a necessary limitation e.g. if only one was used no selection switch would be required.

One fusible link system that can be used in this invention is disclosed in U.S. patent application Ser. No. 10/777,337, supra and includes semi-fusible link system 140, FIG. 7, for multi layer integrated circuit 142 which includes active circuitry 144 disposed on first layer 146. Layer 146 includes metal one layer 148. System 140 also includes semi-fusible link element 150 disposed on second layer 152 having metal two layer 154 which is adapted for interconnecting with metal one layer 148. Although as shown in FIG. 7, layer 152 with semi-fusible link 150 is disposed over layer 146 with active circuitry 144, this is not a limitation, as layer 146 with active circuitry 144 may be disposed over layer 152 with semi-fusible link element 150. Conductor 156 provides an electrical interconnection between metal one layer 148 and metal two layer 154 and enables electrical coupling between semi-fusible link element 150 and active circuitry 144. Therefore, semi-fusible link element 150 can be disposed over active circuitry 144 and/or active circuitry 144 can be displaced over semi-fusible link 150 which leads to a reduction in the amount of chip space utilized on integrated circuit 142 by semi-fusible link system 140.

Selector circuit 160 (e.g., including a transistor such as a NMOS transistor) may be connected to active circuitry 144 and semi-fusible link 150 in the configuration as shown in FIG. 8A. Alternatively selector circuit 160 may be coupled to semi-fusible link element 150 and active circuitry 144 as shown in FIG. 8B.

Figure 9:
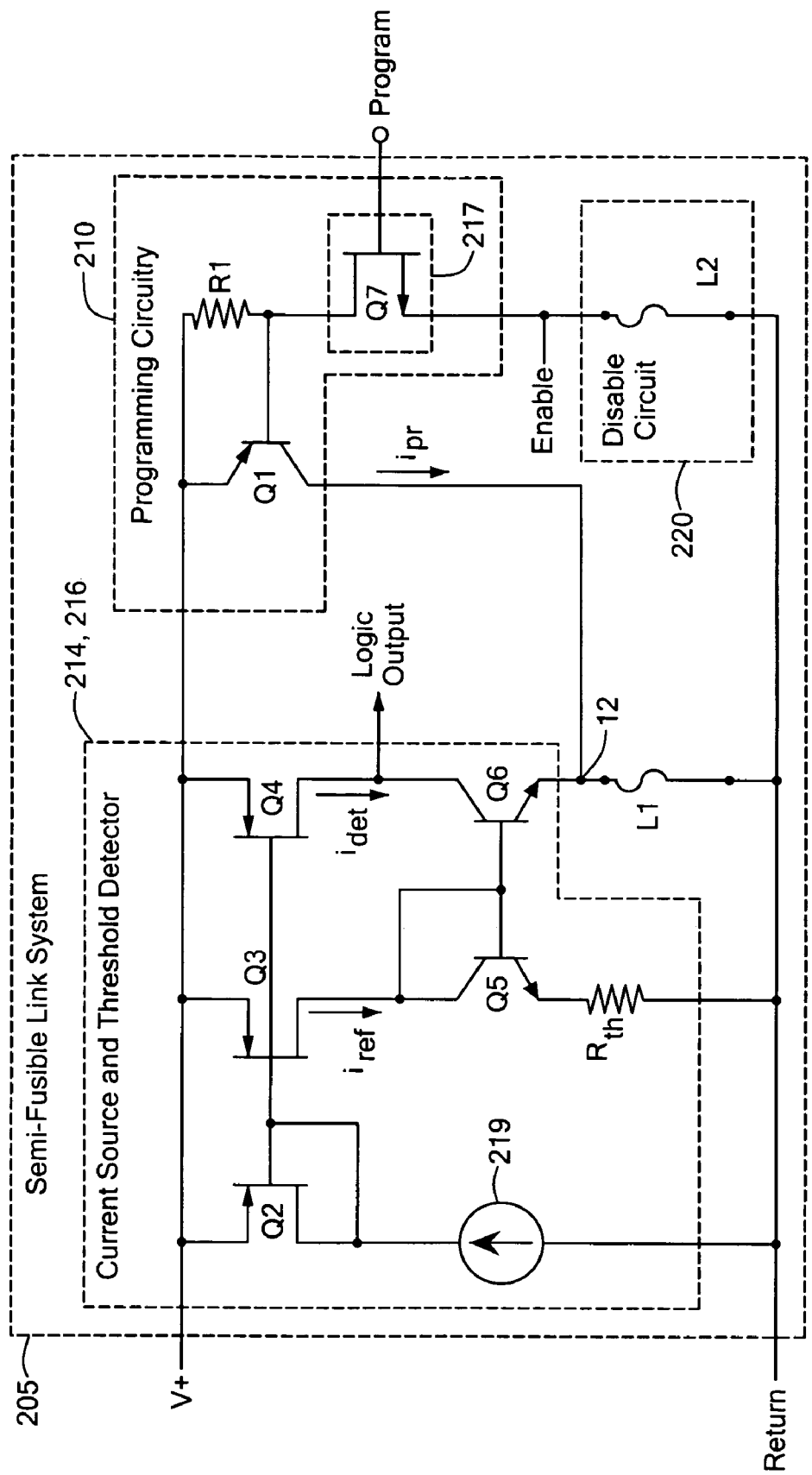
FIG. 9 is a schematic diagram of another embodiment of a semi-fusible link system that may be used in this invention.

Another semi-fusible link system that may be used in this invention is disclosed in U.S. Pat. No. 6,246,243 supra and includes programming circuit 210, FIG. 9, including a transistor Q1, with a PNP bipolar transistor having its current circuit connected between V+ and semi-fusible link L1. Programming circuit 210 includes an activation means 217, which operates by pulling down on Q1's base until Q1 turns on and conducts programming current $i_{pr}$ through L1 causing it to transform from its intact to its blown state. A resistor R1 is preferably connected between Q1's base and emitter to ensure that Q1 is only turned on when its base is pulled low. Note that other transistor types, including NPN and FET transistors, could alternatively be used to provide the necessary programming current.

Current source 219 and a current mirror consisting of transistors Q2, Q3, and Q4 which mirrors the output of current source 219; Q3 and Q 4 produce essentially equal currents $i_{ref}$ and $i_{det}$, respectively. Reference current $i_{ref}$ is connected to a diode-connected transistor Q5 which conducts $i_{ref}$ to the return line via a threshold resistor $R_{th}$. Detection current $i_{det}$ is connected to the current circuit of an output transistor Q6 having its control input connected in common with that of Q5 such that Q5 and Q6 form a current mirror; Q6 conducts $i_{det}$ to the return line via the semi-fusible link L1. The junction of Q6 and Q4 form a comparator output, from which the threshold detector's output (LOGIC OUTPUT) is taken.

The gain of the Q5/Q6 current mirror varies with the ratio of the resistance of link L1 and $R_{th}$. Reference current $i_{ref}$ creates a reference voltage across $R_{th}$, which creates a similar voltage across L1. If the resistance of L1 is less than $R_{th}$, the current in L1 will be greater than that in $R_{th}$, and vice versa. $R_{th}$ is selected such that its resistance is greater than that of the intact L1, but less than that of the blown L1. As a result when L1 is intact, the current in L1 is greater than that in $R_{th}$, so that Q6 sinks all of the detection current $I_{det}$ and pulls LOGIC OUTPUT down to ground. On the other hand, when L1 is blown, its resistance increases and its current falls to less than that in $R_{th}$, such that Q6 sinks to less than $I_{det}$ and LOGIC OUTPUT rises to nearly V+. Thus, the LOGIC OUTPUT value indicates the state of L1, which can be read by additional circuitry (not shown) as needed.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A programmable read only memory comprising:
    a matrix of semi-fusible link memory cells each including a semi-fusible link having an intact impedance and a blown impedance;
    a bit line voltage supply switching circuit for applying a current to at least one selected bit line;
    a word line address decoder for selecting a word line; and
    a program control logic circuit for blowing the semi-fusible links in the memory cells identified by the intersection of the selected word and bit lines.

2. The programmable read only memory of claim 1 further including a sense amplifier circuit connected to said bit lines and a read control logic circuit for enabling said sense amplifier circuit to read out the state of said semi-fusible links in said memory cells addressed by said word line address decoder.

3. The programmable read only memory of claim 1 in which said semi-fusible links are thin film resistors.

4. The programmable read only memory of claim 3 in which said thin film resistors include silicon chromium.

5. The programmable read only memory of claim 2 in which each said semi-fusible link memory cell includes a semi-fusible link and a selection switch connected between a bit line and a word line.

6. The programmable read only memory of claim 5 in which each said selection switch includes a semiconductor switch.

7. The programmable read only memory of claim 2 in which said sense amplifier circuit includes a plurality of sense circuit each including a reference cell and a comparator circuit responsive to a memory current from an associated memory cell and the reference current from the reference cell to provide a logic output representative of the relative values of said currents.

8. The programmable read only memory of claim 7 in which said comparator circuit includes a current mirror for mirroring said memory current and a detector circuit responsive to said mirrored memory current and said reference circuit to provide a logic output representative of the relative values of said currents.

9. The programmable read only memory of claim 8 in which said detector circuit includes a sensing node for summing said mirrored memory current and reference current and an inverter responsive to said sensing node to provide a logic output representative of the relative values of said currents.

10. The programmable read only memory of claim 8 in which said comparator circuit includes a differential amplifier having one input connected to said memory cell and one end of said current mirror and the other input connected to said reference cell and the other end of said current mirror.

11. The programmable read only memory of claim 5 in which said sense amplifier circuit includes a plurality of sense circuits each including a reference cell and a comparator circuit responsive to the memory current from an associated memory cell and the reference current from the reference cell, said reference cell including a selection switch matched to said memory cell selection switch and a reference impedance.

12. The programmable read only memory of claim 11 in which said reference impedance includes a default impedance between said intact impedance and said blown impedance.

13. The programmable read only memory of claim 12 in which said reference impedance includes a low margin impedance between said default impedance and said intact impedance.

14. The programmable read only memory of claim 12 in which said reference impedance includes a high margin impedance between said default impedance and said blown impedance.

15. The programmable read only memory of claim 11 in which said reference impedance includes a short margin impedance between said intact impedance and zero.

16. The programmable read only memory of claim 1 in which said semi-fusible links are diode junctions.

* * * * *